(12) United States Patent
Shelnut et al.

(10) Patent No.: US 6,899,829 B2
(45) Date of Patent: May 31, 2005

(54) CONDUCTIVE POLYMER COLLOIDAL COMPOSITIONS WITH SELECTIVITY FOR NON-CONDUCTIVE SURFACES

(75) Inventors: James G. Shelnut, Northboro, MA (US); Wade Sonnenberg, Edgartown, MA (US); Patrick J. Houle, Sudbury, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 404 days.

(21) Appl. No.: 09/998,117

(22) Filed: Nov. 30, 2001

(65) Prior Publication Data

US 2002/0110645 A1 Aug. 15, 2002

Related U.S. Application Data

(60) Provisional application No. 60/250,048, filed on Nov. 30, 2000.

(51) Int. Cl.[7] .............................. H01B 1/04; H01B 1/24; C25D 5/02; B05D 5/12
(52) U.S. Cl. ....................... 252/511; 252/510; 252/502; 252/519.3; 106/413; 106/445; 427/402; 427/96; 427/304; 427/407; 205/159; 205/125; 205/163; 205/118
(58) Field of Search ................................ 252/511, 510, 252/502, 519.3; 106/413, 445; 427/402, 96, 304, 407; 205/159, 125, 163, 118

(56) References Cited

U.S. PATENT DOCUMENTS

| | | |
|---|---|---|
| 3,099,608 A | 7/1963 | Radovsky et al. |
| 4,895,739 A | 1/1990 | Bladon |
| 4,919,768 A | 4/1990 | Bladon |
| 4,952,286 A | 8/1990 | Bladon et al. |
| 5,240,644 A * | 8/1993 | Barry et al. ................. 252/500 |
| 5,415,762 A * | 5/1995 | Allardyce et al. ........... 205/166 |
| 5,528,000 A | 6/1996 | Allardyce et al. |
| 5,567,355 A * | 10/1996 | Wessling et al. ............ 252/500 |
| 5,667,662 A * | 9/1997 | Sonnenberg et al. ........ 205/162 |
| 5,800,739 A * | 9/1998 | Sonnenberg et al. ........ 252/510 |
| 6,039,859 A | 3/2000 | Sonnenberg et al. |

FOREIGN PATENT DOCUMENTS

| | | | | |
|---|---|---|---|---|
| EP | EP 0 432929 A2 | * | 11/1990 | ............ C08G/73/02 |
| US | EP 0 731192 A1 | * | 9/1996 | ............. C25D/5/54 |

\* cited by examiner

*Primary Examiner*—Mark Kopec
(74) *Attorney, Agent, or Firm*—John J. Piskorski

(57) ABSTRACT

A conductive polymer colloidal composition that selectively forms a coating on a non-conductive surface. The conductive polymer colloidal composition is composed of a polymer and a sulfonate dopant. The conductive polymer colloidal composition may also contain conductive colloidal particles such as conductive carbon or metal salt particles, oxidants, stabilizers, and preservatives. The conductive polymer colloidal composition may be employed to selectively coat the non-conductive parts of printed wiring boards such that a uniform metal layer can be deposited on the conductive polymer coat. In addition to a uniform metal layer being formed over the conductive polymer, adhesion between the metal layer and the printed wiring board is improved.

17 Claims, No Drawings

CONDUCTIVE POLYMER COLLOIDAL COMPOSITIONS WITH SELECTIVITY FOR NON-CONDUCTIVE SURFACES

This application is claims benefit if provisional No. 60/250,048, filed Nov. 30, 2000.

The present invention is directed to conductive polymer colloidal compositions. More specifically, the present invention is directed to conductive polymer colloidal compositions that are selective for plating on a non-conductive surface.

Non-conducting surfaces have been metallized by a sequence of steps such as by catalysis of the non-conductor to render the same catalytic to electroless metal deposition followed by contact of the catalyzed surface with a plating solution that deposits metal over the catalyzed surface in the absence of an external source of electricity. Metal plating continues for a time sufficient to form a metal deposit of the desired thickness. Following electroless metal deposition, the electroless metal deposit is optionally reinforced by electrodeposition of a metal over the electroless metal coating to obtain a desired thickness. Catalyst compositions useful for electroless metal plating are known in the art. An example of a catalyst composition consists of an aqueous colloid of a noble metal such as palladium.

Electroless plating solutions are aqueous solutions containing both a dissolved metal and a reducing agent in solution. The presence of the dissolved metal and reducing agent together in solution results in plate-out of metal when the solution is in contact with a catalytic surface. However, the presence of the dissolved metal and reducing agent together in solution can also result in solution instability and indiscriminate deposition of metal on the walls of containers for such plating solutions. In addition, such plating solutions utilize a complexing agent to hold the metal dissolved in solution. Complexing agents are difficult to waste treat. The reducing agent for such solutions is formaldehyde. Formaldehyde is toxic and subject to environmental regulations.

For the reasons discussed above, attempts have been made to avoid use of an electroless plating solution by the practice of direct plating process where a metal may be deposited directly onto an electrically non-conductive substrate treated to render the same semi-conductive. One such process is disclosed in U.S. Pat. No. 3,099,608, incorporated herein by reference. The process of the '608 patent involves treatment of non-conducting surface with a palladium colloid that forms a semi-conductive film of colloidal palladium particles over the non-conductive surface. For reasons not completely understood, it is possible to electroplate directly over the catalyzed surface of the non-conductor from an electroplating solution though deposition occurs by propagation and growth from a conductive surface. The deposit grows exponentially along the catalyzed surface from this interface. For this reason, metal deposition onto the substrate using this process is slow. Further, deposit thickness may be uneven with the thickest deposit occurring at the interface with the conductive surface and the thinnest deposit occurring at a point most remote from the interface.

U.K. Patent No. 2,123,036, incorporated herein by reference, is alleged to disclose an improvement to the above-described process. In accordance with the process of the U.K. patent, a surface is provided with metallic sites and the surface is electroplated from an electroplating solution containing an additive that is described by the patentee as inhibiting deposition of metal on metallic surfaces without inhibiting deposition on the metallic sites over the non-conducting surface. Thus it is alleged that there is a preferential deposition over the metallic sites with a concomitant increase in the overall plating rate. In accordance with the U.K. patent, the metallic sites are preferably formed in the same manner as in U.S. Pat. No. 3,099,608, i.e., by immersion of the non-conducting surface in a solution of a tin-palladium colloid. The additive in the electroplating solution responsible for inhibiting deposition is described as one selected from the group of dyes, surfactants, chelating agents, brightners and leveling agents. Many of such materials are conventional additives for electroplating solutions.

Further improvements in processes for the direct electroplating of non-conductors are disclosed in U.S. Pat. Nos. 4,895,739; 4,919,768 and 4,952,286, each incorporated herein by reference. In accordance with the processes of the three patents, an electroless plating catalyst is treated with an aqueous solution of a chalcogen, such as sulfur solution to convert the catalytic surface to the chalcogenide. By conversion of the surface to the chalcogenide, greater conductivity is achieved as well as faster plating rates.

The processes of the aforementioned patents provide a substantial improvement over the process described in the U.K. patent. However, it has also been found that treatment of an adsorbed catalytic metal over a non-conductor with a solution of a chalcogenide, especially a sulfide solution, results in the formation of a chalcogenide on all metal surfaces in contact with the solution of the chalcogen. Therefore, if the process is used in the manufacture of printed circuit boards, the copper cladding or conductors of the printed circuit board base material are converted to the chalcogenide together with the catalytic metal. If the chalcogenide of the copper is not removed prior to plating, it can reduce the bond strength between copper and a subsequently deposited metal over the copper.

A further advance in the direct plating of the surfaces of non-conductors is disclosed in published European Application No. 0 520 1915, incorporated herein by reference. In accordance with the invention described therein, a stable colloidal solution of a preformed catalytic chalcogenide is prepared and a surface is then contacted with the colloidal composition where the colloidal chalcogenide adsorbs on the surface. Thereafter, the non-conductor may be electroplated following procedures disclosed in U.S. Pat. No. 4,895,739; 4,919,768 and 4,952,286.

An alternative direct plate process is disclosed in PCT published application No. 89/00204, incorporated herein by reference. In accordance with the process of the published PCT application, the surface of a substrate is pretreated with a solution having an oxidizing capability, removed from the solution and rinsed, introduced into a solution containing a monomer such as a pyrrole, furane, thiophene or its derivatives is formed, residual solution is removed by rinsing; and the coating formed over the substrate is then semi-conductive and capable of direct electroplating. In accordance with the procedure disclosed in the PCT application, the oxidative pre-treatment solution contains salts of permanganate, manganate, periodate and/or cerium IV. The monomer is present in a suitable solvent in an amount of from 5 to 35% by weight. The substrate is immersed in the monomer solution for a time ranging from about several seconds to 20 minutes. Room temperature treatment is satisfactory. The solution used to activate the monomer may contain an oxidative substance such as alkali metal persulfate, alkali metal peroxydisulfate, hydrogen peroxide, an iron salt such as ferric chloride, alkali metal periodates or similar compounds in acidic solution. A solution containing an active oxidizing agent in an amount of from 25 to 75 grams per liter of solution is considered satisfactory. Treatment can be at room temperature with immersion times of from 1 to 10 minutes and treatment is complete when a dark brown or black coloration is formed on the surface of the substrate. Difficulties encountered with this procedure include incomplete coverage of glass fibers and or epoxies or FR4 epoxide/glass printed circuit board substrates that can lead to discontinuities in the coating and the use of volatile organic compounds in the process sequence that may be toxic.

A modification to the above process is disclosed by Gottsfield et al. *J. Electrochem. Soc.*, Vol. 139, No. 1, January 1992, pp. 14–15. In the Gottsfield et al. process, a substance to be plated is immersed directly into a solution of the oxidant and the monomer is then added to the solution to cause in situ formation of polymer in the presence of the substrate. Disadvantages to the Gottsfield et al. process include the formation of polymer on all surfaces in contact with the solution, i.e., the container walls as well as the substrate, a limited life of the treatment solution and possible monomer toxicity.

The disadvantage of the polymer covering the entire surface of a substrate, such as a circuit board, may lead to de-lamination of circuit board layers. When the polymer coats the circuit board, it not only coats the non-conducting parts of the board, but also the conductive portions of the board such as the copper cladding. The bond between the polymer and the copper cladding is not secure. When the individual boards are formed into multi-layer composites, delamination may occur at some point during the life of the multi-layer boards. Such boards employed in electronic devices lead to the break down of the devices, thus shortening the life of the electronic devices. Accordingly, there is a need for selectively coating non-conductive portions of the boards.

In U.S. Pat. No. 5,415,762, incorporated herein by reference, an additional method for direct electroplating of non-conducting surfaces is disclosed. This method uses an aqueous or semi-aqueous suspension of a conductive polymer. Using this suspension, a circuit board may be fabricated by a process where the first step comprises preparation of the circuit board substrate for plating. This includes formation of throughholes, desmearing of the hole walls, conditioning of the hole walls to improve adhesion and etching of the copper cladding to clean the same. Thereafter, the substrate is contacted with the suspension of the conductive polymer. The suspension contains a charged adsorption modifier such that the suspension is attracted to the conditioned dielectric surfaces thus improving adhesion between the substrate and a plated metal. An example of such a modifier is polyamine. The conductive polymer on the dielectric is then directly electroplated with a metal in a conventional manner. The patent further discloses that any conductive polymer suitable for forming a suspension in aqueous media may be used. Examples of suitable conductive polymers include polypyrrole, polyaniline and polythiophene or derivatives thereof. The '762 patent was an improvement over the earlier electroplating methods discussed above.

Although the direct electroplating process and colloidal compositions of the '762 patent were an improvement over the earlier electroplating processes and compositions, the colloidal compositions of the patent suffered from stability problems. During storage the colloidal particles aggregated and precipitated. Such problems limit the commercial suitability of the colloidal compositions because packaging and storing the compositions for prolonged periods prior to use is impractical. It is known in the art that colloidal suspensions of organic particles, such as conductive polymers, may be stabilized to prevent aggregation and precipitation. Stabilizers act by surrounding the organic particles to sterically hinder the particles from attaching to each other and eventually growing large enough to settle out of solution. However, the stabilizers reduce the conductivity of a coating of the conductive polymers adsorbed onto a substrate. The reduced conductivity compromises complete coverage of the non-conductive portions of the substrate such as a circuit board. The aggregation and precipitation problems were addressed in U.S. Pat. No. 5,667,662.

U.S. Pat. No. 5,667,662, the entire disclosure of which is incorporated herein by reference, is directed to stabilizers that may be employed to prevent aggregation and precipitation of conductive polymers during storage. Such stabilizers include non-ionic polyethers having polyalkylene oxide blocks; carboxylates, phosphates, and sulphonates having non-ionic moieties of at least twenty ethylene oxide groups; and sulfate surfactants having from 3 to 1000 ethylene oxide units. Such stabilizers both reduce the aggregation and precipitation of conductive polymers, and do not reduce the conductivity of the conductive polymers. Such stabilizers also have been found useful in stabilizing conductive dispersions of graphite particles as described in U.S. Pat. No. 5,800,739 and U.S. Pat. No. 6,039,859, the disclosures of which are incorporated in their entireties by reference.

Although there are colloidal compositions of conductive polymers that are both stable and provide a coating on a circuit board for the direct electroplating of a metal on the coating, there is still a need in the art for conductive polymer colloidal compositions that are selective for coating non-conductive portions of a substrate and that are stable during storage.

SUMMARY OF THE INVENTION

The present invention is directed to a conductive polymer colloidal composition that is both stable and coats selectively on non-conductive surfaces. The conductive polymer colloidal compositions of the present invention contain a conductive polymer and a dopant having the following general formula:

where R is an alkyl having from two to twelve carbon atoms, unbranched or branched; an alkenyl having from three to twelve carbon atoms, unbranched or branched; a fatty acid chain of from ten to twenty carbon atoms, saturated or unsaturated; an aryl radical, unsubstituted or substituted with two to three methyl groups, a saturated or unsaturated chain of three to twenty carbon atoms, a sulfonic acid group or salt thereof, hydroxyl group, a carboxylic acid group or salt thereof, or a styrene group; a naphthalene group, unsubstituted or substituted with a sulfonic acid group or salt thereof; an anthracene group, unsubstituted or substituted with a hydroxyl group, or an oxo group; a disulfide having from four to six carbon atoms, unsubstituted or substituted with a sulfonic acid group or salt thereof; or a radical having the following general formula:

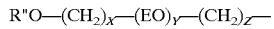

where R" is H, methyl, ethyl, propyl or butyl group; x is an integer of from 12 to 14; y is an integer of from 1 to 14; and z is an integer of from 1 to 5. R' is H, methyl, ethyl or M, where M is a cation.

The conductive polymer colloidal compositions of the present invention may also contain conductive particles of carbon, metals and metal salts to form hybrid conductive polymers. Such particles increase the conductivity of the polymer in the colloidal composition. The increased conductivity provides for a more uniform metal plating layer over the conductive polymer.

Oxidants may be employed in the conductive polymer colloidal compositions to initiate polymerization of monomers, and preservatives are employed to improve the longevity of the colloidal compositions. Stabilizers are included to prevent aggregation and precipitation of the conductive polymers during storage.

Advantageously, the conductive polymer colloidal compositions of the present invention selectively coat non-conductive surfaces. Such surfaces include circuit boards that have both conductive components, and non-conductive parts. The conductive polymers selectively coat the non-conductive portions of the circuit board with no or minimal coating of the conductive components. When the coated surface of the board is plated with a conductive material by a direct electroplating method, there is no adhesion loss between the plated material and the coated non-conductive portions of the board.

The conductive polymer colloidal compositions of the present invention also are stable. Thus, the conductive polymer colloidal compositions may be stored without concern that the polymers may aggregate and precipitate out of solution during storage.

A primary objective of the present invention is to provide a conductive polymer colloidal composition that selectively coats non-conductive materials.

Another objective of the present invention is to provide a stable conductive polymer colloidal composition where the conductive polymers do not aggregate and precipitate out of solution.

A further objective of the present invention is to provide a plated surface on a substrate that does not suffer from adhesion loss.

Still yet another objective of the present invention is to provide a conductive polymer having improved conductivity.

Other objectives and advantages of the present invention will become apparent to those of skill in the art after reading the following detailed description of the invention and the appended claims.

DETAILED DESCRIPTION OF THE INVENTION

The present invention is directed to conductive polymer colloidal compositions that coat selectively on non-conductive surfaces. Colloidal compositions within the scope of the present invention include suspensions of conductive polymer particles, or emulsions of conductive polymer particles and the like. The conductive polymer colloidal compositions of the present invention is stable during storage. The conductive polymers in the colloidal compositions do not readily aggregate and precipitate out of solution. The conductive polymer colloidal compositions contain at least a polymer and a dopant. The dopant has the following general formula:

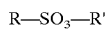

where R is an alkyl having from two to twelve carbon atoms, unbranched or branched; an alkenyl having from three to twelve carbon atoms, unbranched or branched; a fatty acid chain of from ten to twenty carbon atoms; an aryl radical, unsubstituted or substituted with two to three methyl groups, a saturated or unsaturated chain of three to twenty carbon atoms, a sulfonic acid group or salt thereof, a hydroxyl group, a carboxylic acid group or salt thereof, or a styrene group; a naphthalene group, unsubstituted or substituted with a sulfonic acid group or salt thereof, an anthracene group unsubstituted or substituted with a hydroxyl group or an oxo group; a disulfide group having from four to six carbon atoms, unsubstituted or substituted with a sulfonic acid group or salt thereof, or a radical having the following general formula:

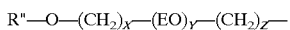

where R" is H, methyl, ethyl, propyl or butyl group; x is an integer of from 12 to 14; y is an integer of from 1 to 14, preferably from 1 to 7, most preferably from 1 to 4; and z is an integer of from 1 to 5.

R' is H, methyl, ethyl or M, where M is a cation. Suitable cations include, but are not limited to, sodium ion, potassium ion, or ammonium ion, and the like.

Examples of such dopants include, but are not limited to, 4-ethylbenzene sulfonic acid, 4-hydroxybenzene sulfonic acid, 1,3-benzene disulfonic acid, 2-mesitylene sulfonic acid, 5-sulfosalicylic acid, 3-sulfobenzoic acid, cumene sulfonic acid, 2-napthalene sulfonic acid, 4-styrene sulfonic acid, xylene sulfonic acid, n-heptane to n-dodecane sulfonic acids, 3,4-dihydroxy-9,10-dioxo-2-anthracenesulfonic acid, bis-(3-sodium sulfopropyl) disulfide, dodecyl diphenyl oxide disulfonate, and o-ethyl dithiocarboxylic acid-(3 sulfopropyl)-ester, and derivatives thereof. Also included are the salts of the foregoing compounds, and derivatives thereof. Suitable salts include, but are not limited to, the sodium and potassium salts. Preferred dopants are 2-mesitylene sulfonic acid, 3-sulfobenzoic acid, bis-(3 sodium sulfopropyl) disulfide, the n-octane to n-dodecane sulfonates and dopants having the following general formula:

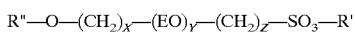

where R', R", x, y, and z are as defined above. Examples of such dopants include, but are not limited to, polyethylene glycol-alkyl-(3-sulfoethyl)-diethers and their potassium and sodium salts. The diethers and their salts may be obtained from Pittsburg Plexiglass/Mazer (Pittsburg, Pa.). Such diethers are the Avanel S® series. One such diether is the Avanel S® 30 which contains 3 moles of ethoxylate. Where y is an integer from 1 to 4, the above sulfonate compounds act as both a dopant and a stabilizer. When such sulfonate compounds are employed in conductive polymer colloidal compositions, no additional stabilizers need be added to prevent aggregation and precipitation of the polymers. Thus, the chance that an incompatibility may arise between added stabilizers and other components of the colloidal composition is reduced. Further, since fewer components are added to the colloidal compositions, the cost of making the compositions is reduced.

The dopants render the polymers intrinsically conductive. While not being bound to any particular theory, the dopants are believed to stabilize oxidized polymer chains locally to remove an electron from the polymer π electron cloud to form radical ions. Upon application of an external potential, the charged radical ion dopants move along the polymer backbone and "hop" from one polymer chain to another to conduct electricity.

Any suitable polymer may be employed to practice the present invention as long as the polymer is compatible with the dopants of the present invention. Compatible, within the scope of the present invention, means that the dopant and polymer interact to form conductive polymer colloidal particles. Examples of such suitable polymers include, but are not limited to, polypyrrole, polyaniline, polythiophene, polyfuran and derivatives thereof. Such polymers are prepared from the monomers pyrrole, aniline, thiophene, furan and derivatives thereof.

Additional components that may be added to the conductive polymer colloidal compositions include oxidants, additional conductive particles, preservatives and stabilizers. Oxidants are employed to initiate polymerization between monomers in the colloidal compositions. Any suitable oxidant used to initiate polymerization between monomers may be employed. Examples of such oxidants include, but are not limited to, palladium metal salts such as palladium sulfide, palladium chloride and the like as well as palladium oxide. Platinum salts may also be employed. Further, sodium persulfate and the like may be employed. The preferred oxidants are the palladium salts.

When palladium and platinum metal salts are employed as oxidants, the palladium and platinum salts are reduced to their respective metals in colloidal form as products of oxidation. Advantageously, the particles of colloidal palladium and platinum metal function as conductive particles in the conductive polymer colloidal composition, and a hybrid conductive polymer colloidal composition is obtained. The particles of the colloidal metals increase the conductivity of the conductive polymer. Thus, by coating a surface with the increased conductive colloidal composition, a more uniform plated surface is obtained. A plated surface using the hybrid conductive polymer colloids of the present invention do not vary in thickness across the plated surface by more than about 0.05 mils, preferably by not more than about 0.01 mils.

In addition to forming a hybrid conductive polymer colloidal composition with palladium and platinum salts, other conductive particles may be employed alone or in combination. Colloidal particles of tin-palladium alloys, copper oxide, copper salts, such as copper sulfate, nickel salts, such as nickel sulfide, silver salts, such as silver nitrate, and the like may be employed. Gold salts may be employed as well. Also dispersed particles of carbon may be employed in the hybrid conductive polymer colloids. Any suitable form of carbon may be employed. Preferred forms of carbon are graphite (crystalline) and carbon black (amorphous) or mixtures thereof. Commercial sources of graphite include, but are not limited to, Crimson® and Graphite® 2000 (both obtainable from Shipley Company, Marlborough, Mass.); Ultrafine Graphite® (by Showa Denko K.K., Tokyo, Japan); Aquadag E® (by Asbury Graphite Mills Inc., Asbury, N.J.). Commercial sources of carbon black include, but are not limited to, Cabot Monarch® 1300, Cabot XC-72R® (both by Cabot Corporation, Boston, Mass.); Acheson Electrodag® 230 (by Acheson Colloids Co., Port Huron, Mich.); and Columbian Raven® 3500 (by Columbian Carbon Co., New York, N.Y.).

Preservatives or antioxidants may be added to the colloidal compositions of the present invention to enhance the longevity of the conductive polymers in the compositions. Examples of such preservatives include, but are not limited to, α-tocopherol, β-tocopherol, phytonadione, ascorbic acid, folio acid and the like.

Stabilizers may also be added to the colloidal compositions, however, when sulfonate dopants having both dopant and stabilizer activity is employed, preferably, additional stabilizers are excluded. Suitable stabilizers include alkylphenol ethoxylates, alcohol ethoxylates, mercaptan ethoxylates, and oleyl alcohol ethoxylates, and the like. Such stabilizers are sold under the tradenames Ipegal® or Rhodasurf®.

Other stabilizers that may be employed are non-ionic polyethers having polyalkylene oxide blocks having the following general formula:

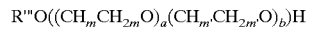
$$R'''O((CH_mCH_{2m}O)_a(CH_{m'}CH_{2m'}O)_b)H$$

where R''' is a hydrocarbon group having from 1 to 40 carbon atoms, m and m' differ from each other and each is one or more integers of from 1 to 4, preferably 2 or 3, and a and b are integers varying between 0 and 1,000 provided that a+b is at least 3, preferably between 7 and 50. R''' may be aliphatic or aromatic. Exemplary aliphatic groups are ethyl, propyl, butyl, octyl, decyl, dodecyl, and the like. Exemplary aromatic groups are benzyl and naphthyl, especially alkyl substituted benzyls. The general formula is intended to include copolymers such as mixed alkylene oxide including copolymers containing ethylene and propylene oxide blocks.

A class of preferred stabilizers are stabilizers with at least twenty ethylene oxide groups in the stabilizers' chain and having the general formula:

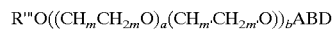
$$R'''O((CH_mCH_{2m}O)_a(CH_{m'}CH_{2m'}O))_bABD$$

where R''', m, m' are defined above, a+b are also as defined above, but their sum provides at least twenty ethylene oxide groups in the formula; B is an alkyl group having from 1 to 8 carbon atoms; A is an anion such as carboxylate, phosphate, sulfonate, and the like; and D is a counteracting cation such as sodium, potassium, ammonium, or an alkaline earth metal such as calcium or magnesium.

Another class of preferred stabilizers are sulfates having the following general formula:

$$C_{m''}H_{2m''+1}(OC_2H_4)_nOSO_3G$$

where m'' is an integer ranging from 3 to 20, G is an alkali metal and n is an integer between 3 and 1000, preferably, between 7 and 50. The alkali metals include, but are not limited to, sodium, or potassium and the like.

The conductive polymer colloidal compositions of the present invention may be prepared by any suitable method. One method is to add each of the components directly into the dispersant or solvent and mix the components until a uniform colloidal suspension or emulsion is formed. Any suitable solvent may be employed. Preferably, the conductive polymer colloidal compositions are aqueous. Reaction conditions for forming the conductive polymer colloids may be in air at about room temperature or slightly below room temperature (from about 25° C. to about 15° C.). The mixture may be heated to induce dissolution or the reactants. When an oxidant is omitted from the reaction mixture, temperatures of from about 30° C. to about 70° C. or higher may be employed. The specific reaction conditions may vary depending on the reactants employed. Some minor experimentation may be necessary to determine optimum conditions for any given set of reactants. The conductive polymer colloidal particles formed in the compositions range in diameter of from about 10 microns to about 200 microns, preferably from about 20 microns to about 80 microns.

Sufficient monomer is employed such that the polymer component composes from about 10.0% by weight to about 50.0% by weight of the colloidal composition, preferably, from about 20.0% to about 30.0% by weight. The dopant composes from about 10.0% by weight to about 60.0% by weight, preferably from about 20.0% to about 35.0% by weight of the colloidal composition. Preferably, dopant and monomer are employed in the composition such that a mole ratio of dopant to monomer ranges from about 0.05 to about 1.0, most preferably, from about 0.2 to about 0.5.

The stabilizer component composes from about 10.0% by weight to about 40.0% by weight, preferably, from about 20.0% to about 30.0% by weight of the colloidal composition. Oxidants compose from about 0.25% by weight to about 5.0% by weight, preferably, from about 1.0% to about 3.0% by weight of the colloidal composition. Additional conductive particles added to the conductive polymer to form the hybrid conductive polymer compose from about 0.5% by weight to about 10.0% by weight, preferably from about 2.0% to about 5.0% by weight of the colloidal composition. Preservatives added to the conductive polymer colloidal compositions to enhance longevity, especially during periods of storage, compose from about 0.01% by weight to about 0.10% by weight, preferably from about 0.05% to about 0.25% by weight of the colloidal composition. The balance of the colloidal composition is the solvent, preferably, water.

A preferred method of preparing the conductive polymer colloidal compositions involves combining monomers along with dopant and stabilizer in solvent or dispersant then mixing to dissolve. By adding the stabilizer to the composition containing the monomers before the colloidal particles are formed, the colloidal particles are stabilized as they form. A solution or suspension of oxidant is then formed by dissolving or suspending the oxidant in a solvent or dispersant. When the dopant has both dopant and stabilizer properties, any additional stabilizer added to the first mixture is optional. Preferably, no additional stabilizer is added. The second mixture containing the oxidant is slowly added to the first mixture containing the monomers, dopant and stabilizer with mixing to form the colloidal particles. Mixing time to form the colloidal particles varies from about 30 minutes to about 2 hours, more often from about 60 minutes to about 90 minutes. Other components such as the additional conductive particles and the preservatives may be added to either composition before mixing. Preferably, the conductive particles and the preservatives are added to the first composition with the monomers, stabilizer and dopant.

When metal oxidants, such as palladium salts, and additional conductive particles are added to the colloidal compositions, preferably, they are in colloidal form. Preferably, particles within the dispersions are spherical and have a mean diameter not exceeding 100 nm. Mean diameter is defined as the average diameter of all the particles within the dispersion. A preferred method for formation of the dispersions involves controlled double jet precipitation. Preparation of monodispersed particles by controlled double jet precipitation is disclosed by Stavek et al., *Chem. Mater.* 1992, 4, 545–555, incorporated herein by reference. The process involves controlled addition of separate solutions of the reactants, i.e., the anion and cation solutions, to a reactor containing a solvent or dispersant for the particles formed. A reactor is provided with inlet lines for introduction of both reactants. The reactor is equipped with heating jackets for temperature control of the reaction as desired. The reactor is further equipped with a thermometer and stirring rod. The reactor may also be equipped with condenser to prevent evaporation of solvent from the reactor.

In the use of the above described reactor to make a palladium sulfide dispersion, the reactor is charged with a suitable liquid dispersant for the particles, an aqueous dispersant desirably containing the surfactant of the invention. The stirring rod is used to agitate the dispersant. Temperature is regulated to the desired reaction temperature. The reactants are introduced into the reactor through their respective feed lines. Addition of the reactants is by slow metering into the reactor using control means such as a peristaltic pump. Flow rate is dependent upon the size of the reactor. For example, using 100 ml of dispersant for purposes of illustration, the reactants may be fed to the reactor at a rate of from about 0.01 to 1.0 moles per minute and preferably, in the stoichiometric ratio required to form a precipitate. The reaction continues until all of the reactants are fed into the reactor. Stirring is continued after completion of the reaction, which is from about 5 minutes to about 1 hour.

The reactants are solutions of an anion and cation capable of reacting to form the desired particle, preferably a noble metal sulfide. Reactants capable of forming palladium sulfide are especially preferred. Each reactant is dissolved in an aqueous solution. Each of the cation and anion solutions may contain the ion in a concentration range of from about 0.00001 to about 0.1 moles per liter and more preferably from about 0.005 to about 0.5 moles per liter. The feed rate of each to the reactor is dependent upon the stoichiometry of the reaction and the concentration of the reactant in the solution. The dispersant solution is preferably water containing a stabilizer or surfactant and a pH adjuster. Preferred metallic cations are noble metals, especially palladium and platinum. Copper, nickel, silver and gold also may be used. The most preferred is palladium.

Carbon black and graphite or mixtures of the two also may be prepared as separate colloidal compositions. The carbon may be present in the dispersion in an amount of from about 0.5% to about 10% by weight of the colloidal composition. The carbon may have a mean particle size of from about 0.3 to about 5.0 microns. Graphite particles of suitable size can be prepared by the wet grinding or milling of raw graphite having a particle size greater than about 50 microns to form a slurry of smaller particles. Graphite particles of suitable size also can be formed by graphitizing already-small carbon-containing particles. When both carbon black and graphite are used, the carbon black may have a substantially smaller particle size than the graphite. The ratio of graphite to carbon black may vary from about 1:100 to about 100:1, and preferably from about 1:10 to about 10:1.

Water soluble or dispersible binding agents may be employed in the carbon and graphite colloids to bind the carbon and graphite particles. Binding agents are believed to assist the dispersed carbon and graphite particles in adhering to the surface of the non-conductive (dielectric) substrate that is to be electroplated. The binding agent may be present in amounts of from 0% to about 15% by weight of the carbon or graphite colloidal composition. Preferably, the binding agent is from about 0.2% to about 10% by weight of the colloidal composition. The binding agent may be a natural or synthetic polymer, polymerizable monomer, or other viscous or solid material (or precursor thereof) that is capable of adhering to the carbon or graphite particles such as a carbohydrate, and anionic polymer, an acrylic, vinyl resins, and the like.

The carbon and graphite colloids are made by any suitable method such as by adding the carbon black to water with vigorous agitation or by ball milling the components together and then dispersing the ball milled material in water with agitation. A stabilizer or any suitable surfactant that may be employed to make the conductive polymer colloidal compositions of the present invention may be added to the carbon black colloid at any time the carbon black is dispersed in the water.

The conductive particle colloidal compositions may be added to the conductive polymer colloidal compositions by any suitable means to form a hybrid conductive polymer colloidal composition. Examples of such methods of combining colloidal dispersions are described above. Advantageously, the hybrid conductive polymer colloidal compositions of the present invention have improved conductivity. The improved conductivity permits for a more even plated surface on a substrate or circuit board. The thickness of the plated surface does not vary more than about 0.05 mils, preferably not more than about 0.01 mils.

The conductive polymer colloidal compositions of the present invention may be applied to any suitable surface to coat the surface followed by a conductive material over the conductive polymer layer. As discussed above the conductive colloidal compositions of the present invention are selective for coating non-conductive surfaces. Thus, when the conductive polymer colloidal compositions of the present invention are applied to a surface, the conductive polymers have an affinity for the non-conductive surface such that the coated surface may be plated without concern that the plated material may separate from the surface. Adhesion of the plated material to the surface is improved. Such properties for a conductive polymer are very important in the printed circuit board industry. The high affinity and selectivity of a conductive polymer coating for a non-conductive surface permits the formation of multi-layer circuit boards such that de-lamination of the layers is eliminated or at least significantly reduced during the life of the boards. Accordingly, an improved product is introduced to the consumer. Also, because the circuit boards prepared with the conductive polymer colloids of the present invention have a longer life, expense to the consumer is reduced.

In the manufacture of printed circuit or wiring boards, the number of steps as well as the sequence and components employed in treating the boards may vary widely. For example, in the manufacture of a double-sided printed circuit board, a first step involves the formation of through-holes by drilling or punching or any other method known in the art. Following formation of the holes, preferably the holes are de-smeared using sulfuric acid or chromic acid or by plasma etching or etch back of holes with chromic acid. Following de-smearing or etch back of holes, the circuit board base material is treated with a glass etch that removes glass fibers extending into the holes from the hole walls. This is followed by a solution that cleans the copper surface and conditions the hole wall to promote catalyst adsorption. Such solutions are often referred to as cleaner conditioners and contain an aqueous alkaline surfactant solution for cleaning soil and a polyamine or quaternary amine to condition the hole wall and impart a positive charge to facilitate adsorption of a negatively charged colloidal catalyst. Proprietary cleaner conditioners are commercially available, and a suitable material is available from Shipley Company, L.L.C. of Marlborough, Mass. and identified as cleaner conditioner 231.

Following the above preparation steps, the processing sequence of the invention may be employed. The next step in the process involves immersion in the colloids of the conductive polymer of the part to be plated. Treatment times vary from about 30 seconds to about 30 minutes, preferably, from about 5 minutes to about 20 minutes. The temperature may vary from about −30° C. to near the boiling point of the colloidal composition. Temperatures below room temperature are preferred.

Treatment with the conductive polymer colloidal compositions of the present invention results in the selective formation of an adsorbed layer of the conductive polymers over the nonconductive surface. The adsorbed layer darkens the non-conductive surface. The coating is suitable for depositing a conductive material onto the conductive polymer layer by any suitable means. Preferably, the conductive material is deposited by direct electroplating. When the surface is a copper-clad printed circuit base material, the copper cladding preferably is cleaned such as, for example, by use of a sulfuric acid-hydrogen peroxide etchant. Preferably, the etchant is used at room temperature for a period of time ranging from about 1 to about 3 minutes. When copper cladding is present or any conductive component is present, the conductive polymer selectively coats the non-conductive parts. Selectively coating means that about 90% to about 100% of the conductive polymer in the colloidal composition coats the non-conductive parts.

The next step in the process of making a printed circuit board involves depositing a conductive material directly over the adsorbed coating of the conductive polymers. Any suitable method for depositing a conductive material on a surface may be employed. Preferably, direct electroplating is used. Any suitable direct electroplating method employed in the art may be used to practice the present invention. An example of a suitable direct electroplating procedure is disclosed in the above referenced U.K. patent. The electroplating process may use electroplating solutions such as those disclosed in the U.K. patent, but most commercially available electroplating solutions contain additives that make the same suitable for the process of the invention. The preferred electroplating metals in accordance with the invention are copper and nickel though the process is suitable for electroplating of any desired metal. Electroplating solutions compose an aqueous acid solution of the metal desired to be plated together with proprietary additives from the group of dyes, surfactants, chelating agents, brightners, leveling agents and the like. Acids used in the formulation of the baths are acids with a high ionic dissociation constant for maximum conductivity such as sulfuric acid, fluroboric acid, sulfamic acid and the like. Dyes used in such baths may include methylene blue, methyl violet and other n-heterocyclic compounds. Suitable surfactants included in such baths are nonionic surfactants such as alkyl phenoxypolyethoxyethanols, wetting agents and water soluble organic compounds such as compounds containing multiple oxyethylene groups have been found effective. A preferred group of such compounds include polyoxyethylene polymers having from as many as 20 to 150 repeating units. Also included in this class of materials are block copolymers of polyoxyethylene and polyoxypropylene. The additives described above are added to the solution in conventional concentrations.

In the plating process, the surface to be plated is used as a cathode in an electroplating cell. Current density varies from about 5 to about 40 amps per square foot, depending upon the holes to be plated, the thickness of the board and the composition of the electroplating solution used. The plating solution is maintained at a temperature ranging from about room temperature to about 40° C. Plating is continued for a time sufficient to form a deposit of desired thickness. For circuit board manufacture the thickness may range from about 0.5 to 2.0 mils, preferably, from about 1 to about 1.5 mils. Plating time ranges from about 15 to about 90 minutes. The deposit formed by the process is uniform in thickness, free of defects and strongly bonded to the surface of the non-conductor over which it is plated. Bond strength is satisfactory to withstand solder-shock testing as used in printed circuit board manufacture.

The following examples are intended to further illustrate the invention, but are not intended to limit the scope of the invention.

EXAMPLE 1

The following example illustrates a single-stage method of preparing a polypyrrole colloidal suspension.

To 75 ml of deionized water add about 5.4 gms of 2-mesitylene sulfonic acid dopant, about 2 gms of pyrrole monomer and about 5.4 gms of ethylene oxide/propylene oxide copolymer nonionic surfactant (Tetronic® 908 from BASF, Wyandotte, Mich.). Stir to dissolve the components.

To about 25 ml of deionized water add about 6.6 gms of palladium sulfate oxidant and stir to dissolve. Add the palladium sulfate solution slowly to the first composition while stirring. The mixture turns green than black indicating the formation of polypyrrole. Continue stirring for about 1 hour following the last addition of the oxidant solution. The resulting conductive polypyrrole colloidal suspension may be used to selectively coat non-conducting portions of a substrate surface by direct electroplating.

EXAMPLE 2

A number of compounds were tested for their ability to form conductive polymers that are selective for coating on a non-conductive surface.

Colloids of conductive polypyrrole were prepared in 250 ml disposable beakers. The suspensions were prepared at room temperature and stirred by a stir bar on a magnetic stirrer.

The order of the addition was as follows:

1. About 100 ml of deionized water was added to each beaker;
2. Dopant and stabilizer were added to each beaker;
3. Each solution was brought to 180 ml with deionized water;
4. Pyrrole monomers were added to each beaker; and
5. Oxidant was added to each beaker.

The oxidant was sodium persulfate and was added to give 2 electrons per mole of pyrrole. This resulted in less than 100% conversion of pyrrole. For complete conversion, the oxidant had to remove 2.3 electrons per mole of pyrrole.

The suspensions were continually stirred during mixing and for about ½ hour after adding the oxidant to form colloidal suspensions of conductive polypyrrole particles. The colloidal suspensions were allowed to stand overnight. Before checking functionality, the colloidal suspensions were checked for stability. Settling of the colloid or visual observation of obvious large particles in the solution were indications of poor colloidal stability, and such solutions were discarded.

Three dopant ratios were examined while holding the pyrrole concentration constant at about 10 g/l. The ratios were 0.3, 1.0, and 2.0 moles of dopant to about 1 mole of pyrrole. The two stabilizers that were employed were Avanel S® 150 or Tetronic® 908. Avanel S® 150 is a polyethylene glycol-alkyl-(3-sulfoethyl)-diether potassium salt obtainable from Pittsburg Plexiglass/Mazer of Pittsburg, Pa. Tetronic® 908 is an ethylene oxide/propylene oxide copolymer nonionic surfactant obtainable from BASF of Wyandotte, Mich. The stabilizers were employed to determine the effect of stabilizer type on dopant efficacy. The Avanel S® 150 was added at a concentration of about 1.5 g/g of pyrrole. In suspensions where Tetronic® 908 was added, it was added to the colloidal suspensions at about 1 g/g of pyrrole. The Tetronic® 908 proved to be a good colloid stabilizer, but resulted in poor plating functionality pot life. Tetronic® 908 was used primarly to determine the performance of aromatic compounds as dopants.

Because some ethoxylated compounds were found to act both as stabilizers and dopants, they were given an additional screen. They were added to the solutions at about 25 g/l, about 50 g/l and about 75 g/l. Neither Avanel S® 150 nor Tetronic® 908 were added to these solutions. The polyethylene glycol-alkyl-(3-sulfopropyl)-diethers that were found to act as both stabilizers and dopants had 1 to 4 moles of ethoxylate, and had good selectivity for the FR4 with added stabilizers (see Table I) or without stabilizers.

Plating functionality of the colloidal compositions that passed the colloid stability screen were checked in the following manner. Copper clad epoxide/glass FR4 coupons, about 2.3 cm to about 8 cm, were cut from about 2.36 mm thick test boards. Each coupon had an array of 10 each of the following hole diameters: about 0.91 mm, about 0.61 mm, about 0.46 mm and about 0.36 mm. There also were eight index holes about 2.36 mm in diameter in each coupon. The surfaces of the holes were epoxide/glass and not copper clad.

Each coupon was processed as follows:

1. De-smeared by immersion in about 6 g/l Nalco 820 (an ammonium phosphate obtainable from Nalco Inc.) for about 5 to 6 minutes at about 40° C.;
2. Rinsed with deionized water for about 4 minutes;
3. Immersed in a conductive polypyrrole colloidal composition for about 15 minutes without agitation;
4. Rinsed with deionized water for about 1 to about 2 minutes; and
5. Dried at about 95° C. for about 5 to about 6 minutes.

Before copper plating the coupons, the affinity of the conductive polypyrrole colloidal compositions on the epoxide/glass exposed parts and copper cladding was qualitatively assessed. Darkening of the copper or epoxide/glass surface indicated adsorption of the conductive polymer. A scale of 0 to 5 (0 being no adsorption) was used to rate the adsorption of the conductive polymer. The darker the surface the more the conductive polymer had been adsorbed onto the surface. Optimum selectivity of the conductive polypyrrole colloidal composition for FR4 was rated 0 for the copper cladding and 5 for the coupon edge (epoxide/glass). See the tables below for the results.

The coupons coated with the conductive polymer were then copper plated in about 50 liters of Electroposit® 1100 plating tanks. The plating conditions were about 5 minutes at about 25 asf. The coupons were then evaluated for hole coverage by recording the number of holes for each hole size that were completely covered with copper. The hole coverage was determined visually using a 10× eye loupe. Optimum copper coverage of the conductive polymer coated hole was rated a 10/10 for each hole size. In addition, the edge coverage and index hole coverage was rated on a scale of from 0 to 5, with 5 being complete coverage. The better the coverage the better the polymer acted as a conductive polymer for copper plating.

The results are disclosed in the Tables below. Table I lists dopants that, when used with Avanel S® 150 as a stabilizer, resulted in polypyrrole colloidal systems that provided optimum to partial plating functionality. All dopants listed in Table I gave good coverage of the 0.36 mm diameter holes. Table II lists colloidal compositions that were functionally stable for at least two weeks, while Table III lists colloidal compositions that were stable for one day to two weeks.

A recommended ratio of moles of dopant/moles of pyrrole was determined to be about 0.3. The ratio of about 0.3 (expressed as gms dopant/gms pyrrole) was compared in column 2 with the range observed for the ratio. The wider the range the more tolerant the colloidal compositions were to variations in colloid-dopant concentrations. In other words, the colloidal compositions remained stable without any indication of precipitation. Some of the colloidal compositions exhibited a very wide tolerance to the amount of dopant present as can be seen by the mole ratios of greater than 5, and a selectivity for FR4 (epoxide/glass) of 4, or 5. Table I also gives the experimentally observed ratio of grams of Avanel S® 150 to grams of pyrrole that provides functional colloids (column 4).

As indicated by a "YES" under the "Dopant & Stabilizer" column, certain aliphatic ethoxylated sulfonated polymers behaved as both a dopant and a stabilizer. Whether or not the sulfonated compounds performed both functions depended on the moles of ethylene oxide in the polymer chain. When the sulfonated polymer had from 1 to 4 moles of ethylene oxide in the polymer chain, the sulfonated polymer behaved as both a dopant and a stabilizer.

Preferred dopants had a selectivity for the epoxide/glass FR4 of 5 and a selectivity for copper of 0 or 1. The most preferred dopants from a plating and selectivity standpoint were Witconate AOK®) (sodium salt of C14–C16 olefin sulfonates obtainable from Witco) and Avanel S® 30 (polyethylene glycol-alkyl-(3 sulfoethyl)-diether, potassium salt obtainable from Pittsburg Plexigalss/Mazer).

Table III lists compounds that acted as dopants to provide functional polypyrrole colloidal compositions where Tectronic® 908 (ethylene oxide/propylene oxide copolymer nonionic surfactant obtainable from BASF) was used as the stabilizer. All of the compounds in Table III gave plating functionality limited in time from a day to not more than two weeks. Table IV lists the compounds that gave partial plating coverage one day after they were made into colloidal compositions. The experimentally determined ratio of dopant to pyrrole concentration expressed in moles is in column 3. Selectivity for coating on the epoxide/glass FR4 and the copper cladding is listed in columns 5 and 6 of Table III and columns 6 and 7 of Table IV. Functional performance with respect to coverage of the 0.36 mm diameter hole is listed in Table III, and for the 0.46 mm and 0.36 mm diameter holes in Table IV. Optimum hole coverage was rated as 10/10.

The dopants paratoluene sulfonic acid, 2-mesitylene sulfonic acid, 3-sulfobenzoic acid, the n-octane through n-dodecane sulfonates and bis-(3-sodium sulfopropyl) disulfide produced optimum coverage of the 0.36 mm diameter hole one day after the colloidal compositions were prepared. Although paratoluene sulfonic acid showed optimum coating of the 0.36 mm diameter hole and a selectivity for FR4 of 5, paratoluene sulfonic acid had a selectivity for copper of 2-3. Such a high selectivity for copper is not desirable. The best overall performers for both hole coverage and selectivity for FR4 were 2-mesitylene sulfonic acid, the heptane through decane sulfonates, bis-(3-sodium sulfopropyl)-disulfide and 3-sulfobenzoic acid.

TABLE I

Dopants that Produced Functionally Stable Colloids for Two Weeks
Avanel S ® 150 was Colloid Stabilizer

| Compound or Tradename | 0.3 mole/mole Ratio | Observed Ratio, Dopant to Pyrrole | Observed Avanel ® S 150 Ratio g/g | Dopant & Stabilizer | Selectivity for FR4 | Selectivity for Copper |
|---|---|---|---|---|---|---|
| Avanel S ® 150 | 5.87 | 6–9 | 1–2 | YES | 4–5 | 0–1 |
| Ralufon ® F5-13 | 2.67 | 2–4 | — | YES | 5 | 1–2 |
| Ralufon ® F3-13 | 2.13 | 2.13 | 1.5 | YES | 5 | 0–1 |
| Ralufon ® F4-I | 1.94 | 1.94 | 1.5 | YES | 5 | 1 |
| Sodium C14–C16 Olefin sulfonate | 1.42 | 1.2–1.67 | 1.5–2.5 | NO | 5 | 1 |
| Sodium α Olefin C14–C16 sulfonate | 3.55 | 3.55 | 1.5–2.5 | NO | 5 | 1 |
| Sodium α Olefin C14–C16 perchloro sulfonate | 3.55 | 3.55 | 1.5–2.5 | NO | 5 | 1 |
| Sodium α Olefin C14–C16 sulfonate | 3.55 | 3.55 | 1.5–2.5 | NO | 5 | 1 |
| Sodium Olefin Sulfonate | 3.63 | 3.63–12.1 | 1.5 | NO | 5 | 1 |
| Sodium C14–C16 sulfonate | 3.63 | 3.63–12.1 | 1.5 | NO | 4–5 | 1 |

TABLE I-continued

Dopants that Produced Functionally Stable Colloids for Two Weeks
Avanel S ® 150 was Colloid Stabilizer

| Compound or Tradename | 0.3 mole/mole Ratio | Observed Ratio, Dopant to Pyrrole | Observed Avanel ® S 150 Ratio g/g | Dopant & Stabilizer | Selectivity for FR4 | Selectivity for Copper |
|---|---|---|---|---|---|---|
| Alkyl diphenyl oxide disulfonate, disodium salt | 5.45 | 5.45 | 1.5 | NO | 4 | 1 |
| Mixture of sodium mono- and didodecyl-phenoxy-benzne-disulfonates | 5.76 | 5.76 | 1.5 | NO | 3–4 | 1–2 |
| Alky diphenyl oxide disulfonate | 5.42 | 5.42 | 1.5 | NO | 4 | 1 |
| Dodecyl diphenyl oxide disulfonate | 5.76 | 5.76 | 1.5 | NO | 4 | 2 |
| Alkyl diphenyl oxide disulfonate | 5.55 | 5.55 | 1.5 | NO | 5 | 1–2 |
| Alkyl diphenyl oxide disulfonate | 5.76 | 5.76 | 1.5 | NO | 5 | 1–2 |
| 4-Octyl benzene sulfonate | 1.32 | 1.32–4.4 | 1.5 | NO | 4–5 | 1 |
| Poly(4-vinyl-pyridinium paratoluene sulfonate) | — | 12.5 | 1.5 | NO | 4.5 | 1 |
| C12–C14 α fatty acid ester sulfonate | 1.51 | 1.51 | 1.5 | NO | 5 | 1 |
| C12–C18 α fatty acid ester sulfonate | 1.63 | 1.63 | 1.5 | NO | 5 | 1 |
| Phenylphosphinic acid | 0.64 | 2.13 | 1.5 | NO | 4–5 | 0–1 |

The Ralufon® F5-13, F3-13 and F4-I are polyethylene glycol-alkyl-(3-sulfopropyl)-diether, potassium salts having from 1 to 4 moles of ethoxylate. The Ralufon® F5-13, F3-13 and F4-I may be obtained from Raschig Company. Avanel® S 30 is a polyethylene glycol-alkyl-(3-sulfoethyl)-diether having 3 moles of ethoxylate. Avanel® S 30 is obtainable from Pittsburg Plexiglass/Mazer of Pittsburg, Pa.

TABLE II

Dopants that Produced Polypyrrole Colloids that were Stable for One Day to Two Weeks.
Avanel ® S 150 was the Colloidal Stabilizer.

| Compound or Tradename | 0.3 mole/mole Ratio | Observed Ratio, Dopant to Pyrrole | Observed Avenal ®S 150 Ratio g/g | Dopant & Stabilizer | Selectivity for FR4 | Selectivity for Copper |
|---|---|---|---|---|---|---|
| Octane to decane sulfonates | 0.98–1.1 | 0.98–1.1 | 1.0 | NO | 4–5 | 4–5 |
| Poly(sodium 4-styrene sulfonate) | — | 1–2 | 1.5 | YES | 4 | 0–1 |

TABLE II-continued

Dopants that Produced Polypyrrole Colloids that were Stable for One Day to Two Weeks. Avanel ® S 150 was the Colloidal Stabilizer.

| Compound or Tradename | 0.3 mole/mole Ratio | Observed Ratio, Dopant to Pyrrole | Observed Avanel ®S 150 Ratio g/g | Dopant & Stabilizer | Selectivity for FR4 | Selectivity for Copper |
|---|---|---|---|---|---|---|
| Avenal ®S 35 | — | 2–3 | 1.5 | NO | 4–5 | 1 |
| OPX ® | 6.34 | 6.34 | 1 | NO | 4 | 1 |
| Condensed sodium naphthalene sulfonic acid | — | 2.07 | 1.5* | YES** | 3 | 0 |
| Condensed naphthalene sulfonic acid | — | 1.80 | 1.5* | YES** | 3 | 0 |
| Anthrquinone-2,6-disulfonic acid, disodium salt | 1.86 | 6.19 | 1.5* | NO | 5 | 2 |
| Ralufon ® N6 | 2.8 | 2.5 | None*** | YES | 3–4 | 3 |
| Phenylphosphonic acid | 0.71 | 2.37 | 1.5 | NO | 4–5 | 0–1 |
| 2,3 Nitrobenzene sulfonic acid | 1.28 | 4.26 | 1.5 | NO | 5 | 5 |

*Only plated the 0.91 mm and the 0.61 mm diameter holes.
**Colloids were very thick
***Only plated the 0.91 mm and the 0.61 mm diameter holes.

Avanel® S35 is polyethylene glycol-(4-nonylphenyl)-(3-sulfoethyl)-diether sodium salt with 3 moles of ethoxylate. Ralufon® N9 is a polyethylene glycol-(4-nonylphenyl)-(3-sulfopropyl)-diether sodium salt obtainable from Raschig. OPX® is O-ethyl dithiocarboxylic acid-(3-sulfopropyl)-ester, potassium salt obtainable from Raschig.

TABLE III

Dopants that Produced Polypyrrole Colloids that were Functionally Stable for One Day to Two Weeks. Tetronic ® 908 was the Colloid Stabilizer.

| Compound or Tradename | Observed Tectronic ® 908 Ratio, g/g | Observed Molar Ratio | 0.36 mm hole coverage 1 day age | Selectivity for FR4 | Selectivity for Copper |
|---|---|---|---|---|---|
| Paratoluene sulfonic acid | 5.7 | 2/1 | 10/10 | 5 | 2–3 |
| 4-ethylbenzene sulfonic acid | 2.79–5.58 | 1–2/1 | 2–5/10 | 5 | 1 |
| 4-hydroxybenzene sulfonic acid | 8 | 2/1 | 8/10 | 5 | 0–1 |
| 1,3-benzene disulfonic acid | 4.25 | 1/1 | 4/10 | 4–5 | 1 |
| 2-mesitylene sulfonic acid | 3.55–7.09 | 1–2/1 | 10/10 | 5 | 0–1 |
| 5-sulfosalicylic acid | 3.82–7.63 | 1–2/1 | 2/10 | 5 | 1–2 |
| Cumene sulfonate | 9.55 | 2/1 | 3/10 | 3–4 | 0–1 |
| 3-sulfobenzoic acid | 6.73 | 2/1 | 10/10 | 5 | 1–2 |
| 2-naphthalene sulfonic acid | 3.1 | 1/1 | 8/10 | 4–5 | 0–1 |
| Heptane sulfonate | 0.93 | 1/1 | 10/10 | 5 | 0–1 |
| Octane sulfonate | 0.98–3.24 | 0.3–1 | 10/10 | 5 | 0–1 |
| Nonane sulfonate | 1.03 | 0.3 | 10/10 | 5 | 0–1 |
| Decane sulfonate | 1.10 | 0.3 | 10/10 | 5 | 0–1 |
| Sodium C14–C16 olefin sulfonate | 1.68 | 0.3 | 7/10 | 4 | 0–1 |

TABLE III-continued

Dopants that Produced Polypyrrole Colloids that were Functionally Stable for One Day to Two Weeks. Tetronic ® 908 was the Colloid Stabilizer.

| Compound or Tradename | Observed Tectronic ® 908 Ratio, g/g | Observed Molar Ratio | 0.36 mm hole coverage 1 day age | Selectivity for FR4 | Selectivity for Copper |
|---|---|---|---|---|---|
| Sodium olefin sulfonate | 3.63–12.1 | 0.3–1 | 9/10 | 4 | 0–1 |
| Sodium C14–C16 olefin sulfonate* | 12.1 | 1 | 0/10 | 4–5 | 0–1 |
| Bis-(3-sodium sulfopropyl)-disulfide | 5.3–10.6 | 1–2/1 | 10/10 | 4–5 | 0–1 |
| Acid Red 106** | — | 0.3–1 | — | 3 | 0–1 |

*Rhodical ® 301-10 (obtainable from Rhone-Poulenc) had a 3/10 coverage for the 0.46 mm hole.
**Acid Red ® 106 dye is obtainable from Aldrich (Milwaukee, WI).

TABLE IV

Dopants that Produced Partially Functional Colloids. Tetronic ® 908 was used as the Colloid Stabilizer.

| Compound or Tradename | Observed Tetronic ® 908 Ratio g/g | Observed Molar Ratio | Coverage (1 day age) 0.46 mm hole | Coverage (1 day age) 0.36 mm hole | Selectivity for FR4 | Selectivity for Copper |
|---|---|---|---|---|---|---|
| 4-styrene sulfonic acid | 3.1 | 1/1 | 4/10 | 4/10 | 5 | 1 |
| Xylene sulfonic acid | 3.1 | 2/1 | 8/10 | 0/10 | 4–5 | 0–1 |
| 2-sulfobenzoic acid | 6.1 | 2/1 | 5/10 | 0/10 | 5 | 1 |
| 1,5-naphthalene sulfonic acid, sodium salt | 1.5 | 0.3/1 | 5/10 | 0/10 | 4 | 0–1 |
| Alizarin Red ®* | 1.54 | 0.3/1 | 6/10 | 0/10 | 4 | 0–1 |
| OPX ® | 4.23 | 1/1 | 10/10 | 0/10 | 4–5 | 0–1 |
| Saccharine-N-3-propane sulfonate, sodium salt | 2.94 | 0.3/1 | 6/10 | 0/10 | 5 | 1 |
| 2,4-nitrobenzene sulfonic acid | — | 1/1 | 8/10 | 0 | 5 | 2 |
| 3-nitrobenzene sulfonic acid | — | 1/1 | 10/10 | 0 | 5 | 2 |
| C16–C18 α fatty acid ester sulfonates | — | 0.3/1 | 10/10 | 2 | 3–4 | 0–1 |

*3,4-dihydroxy-9,10-dioxo-2-anthracenesulfonic acid, sodium salt.

EXAMPLE 3

Eight conductive polypyrrole colloidal compositions were tested for their functionality. The eight colloidal compositions were prepared in 4 liter glass battery jars. The colloidal compositions were prepared at room temperature (about 20° C.) and stirred using 2-inch stir bars on a magnetic stirrer. The order of the addition of the components was as follows:

1. About 2 liters of deionized water was added to each beaker;
2. Dopant and stabilizer were added and mixed;
3. Each mixture was brought to about 3.6 liters with deionized water;
4. About 40 gms of pyrrole was added to each beaker and mixed;
5. About 354 mls of about 400 g/l sodium persulfate oxidant solution was added to each beaker; and
6. The mixture in each beaker was stirred for about 1 hour. The colloids were checked for functionality with Shipley Company 0.024 cm thick multilayer test panels. The part size was about 10 cm×10 cm containing 30 holes held vertically in basket racks. The parts were paddle agitated at about 15 rpm for each process step. The parts were rinsed in deionized water without paddle agitation. Prior to colloid treatment, the parts were copper plated in an Electroposit® 1100 plating bath obtainable from Shipley Company, Marlborough, Mass.) at about 20 asf for about 100 minutes at a TBA (total brightner amount) value between about 4–6 units. Each of the eight colloids was checked using a 2, 3 or 5 step process as disclosed in Table V below. All % are by weight.

vsl=throw or about 35% to about 40% dimpling or poor fiber coverage;

sl=throw or about 20% to about 35% dimpling or poor fiber coverage; and th=throw or less than about 20% dimpling or poor fiber coverage.

The vsl, sl, th defects or the amount of dimpling on the copper plated holes were measured by counting the dimpling

TABLE V

| Step Number | Two Step Process | Three Step Process | Five Step Process |
|---|---|---|---|
| 1 | Conditioner treatment for about 5 min. followed by a deionized water rinse for about 2–4 min. | Conditioner treatment for about 5 min. followed by a deionized water rinse for about 2–4 min. | Conditioner treatment for about 5 min. followed by a deionized water rinse for about 2–4 min. |
| 2 | Colloid treatment for about 5 min. followed by a rinse with deionized water for about 1–2 min. then dry at about 90° C. for about 5 min. | Colloid treatment for about 5 min. followed by a rinse with deionized water for about 1–2 min. then dry at about 90° C. for about 5 min. | Conditioner etch with 3.5 g/l of bis-(3-sodium sulfopropyl) disulfide + 1% $H_2SO_4$ then rinse about 1–2 min. with deionized water. |
| 3 | — | 5700 etch with 3.5% $H_2O_2$, 20% acetic acid, 25 ppm of Cl at 7 micro-inches/min. at about 33° C. for about 1.5 min. | Colloid treatment for about 5 min. followed by a rinse with deionized water for about 1–2 min. then dry at about 90° C. for about 5 min. |
| 4 | — | — | About 45 Sec. 75% Bella post-dip followed by deionized water rinse for about 1–2 min. then dry at about 90° C. for about 5 min. |
| 5 | — | — | 5700 etch with 3.5% $H_2O_2$, 20% acetic acid, 25 ppm of Cl at 7 micro-inches/min. at about 33° C. for about 7 min.* |

*The longer etch time for the 5 step process was due to the increased adsorption promoted by the post-dip.

Conditioner in the processes disclosed in Table V was 6 g/l an ammonium phosphate material from Nalco Inc., 1 g/l of an amphoteric surfactant (Triton® QS-15) at a pH of from about 10.5 to about 10.8 and at a temperature of about 40° C.

Each colloidal composition was functionally checked over an eight week period or until coverage decreased. The functional properties that ranked the colloidal compositions were small hole coverage and interconnect failure after solder floating. The resistance of the 10 cm×10 cm parts containing thirty weeks holes also was recorded. The edges of the parts were sanded prior to measurement.

The exact throwing power in the 14 mil diameter hole was not measured. Instead coverage was rated by the following method. The number of very slight (vsl), slight (sl), and thin (th) holes was counted, and the coverage factor CF of conductive polymer coating copper was determined.

$$CF = \frac{\#vs1 + 2 \text{ times} \# s1 + 4 \text{ times} \# th}{\# \text{holes}}$$

by using a microscope. The higher the CF value, the more dimpling and the less desirable the colloidal composition was. The most desirable colloidal compositions had a CF=0. A CF=0 meant that no dimpling was found when the copper plated holes were examined for conductive polymer deposits.

The interconnect failure was evaluated after two solder shocks done at about 290° C. for about 10 seconds each with about a 4 min. cool down in between each solder shock. The cross-sections were then etched prior to evaluation using a 3.5% by weight alkaline peroxide solution.

The results are presented in Tables VI through X. The first three tables look at the measured functional properties of each of the eight colloids over time. The colloids had each functional property measured at 0, 2, 4, 6 and 8 weeks to observe changes over time. Tables IX and X summarize the averages of the functional properties for each of the colloidal compositions measured. Resistance is measured in megohms unless specified otherwise. K=kilohms in Table VI below. The resistance values in Table VI, and all values in Tables VII through X below are in chronological order of 0, 2, 4, 6, and 8 weeks.

TABLE VI (Resistance)

| Dopant | Stabilizer | Two-Step Process | Three-Step Process | Five-Step Process |
|---|---|---|---|---|
| Sodium C14–C16 olefin sulfonate | Ralufon ® F 11-13 | 35K, 77K, 192K, 342K, 1.5 | 13, 3, 17, 23, 590 | 6, 1, 61, 168, 4 |
| Ethyl-benzene sulfonate | Rodasurf ® TB 970 | 28K, 312K, 200K, 297K, 1.7 | 1, 5, 5, 47, 100 | 5, 2, 26, >2000, 70 |
| C12–C14 α fatty acid ester sulfonate | Avanel ® S 150 | 78K, 63K, 290K, 610K, 4 | 2, 4, 45, 476, 190 | 17, 1, 305, 124, 390 |
| Paratoluene sulfonic acid | Pluronic ® F 127 | 1.2, 350K, 195K, 768K, 660K | 1, 450, 58, 7, 500, 17 | 19, 1, 123, 81, 6 |
| Paratoluene sulfonic acid | Rodasurf ® TB 970 | 58K, 133K, 110K, 706K, 1.4 | 55, 20, >2000, 38, 50 | 1, 7, 21, 52, 24 |
| Cumene sulfonate | Pluronic ® F 127 | 131K, 6, 5, 6, 4.7 | 235, 8, 380, 29, 222 | 14, 10, >2000, 31, 40 |
| 3-sulfobenzoic acid | Pluronic ® F 127 | 856K, 234K, ---, 161K, 143K | 68, 7, ---, 35, 55 | 2, >2000, ---, 1700, 305 |
| Xylene sulfonate | Pluronic ® F 127 | ---, 56K, ---, 41K, 873K | ---, 10, ---, 11, 67 | ---, 56, ---, 101, 21 |

Ralufon® F 11-13 is a polyethylene glycol-alkyl-(3-sulfopropyl)-diether potassium salt obtainable from Raschig Company; Rodasurf® TB 970 is a linear alcohol ethoxylate with an HLB of 10 obtainable from Raschig Company; Avanel® S 150 is a polyethylene glycol-alkyl-(3-sulfoethyl)-diether, potassium salt having 15 moles of ethoxylate, and obtainable from Pittsburg Plexigalss/Mazer of Pittsburg, Pa.; and Pluronic® F 127 is a polyoxyethylene-polyoxypropylene block copolymer having a molecular weight of about 12,600 and an HLB between about 18 and 23 that is obtainable from BASF of Wyandotte, Mich.

The two step process started in the 100 Kilohms range but climbed about 1 megohm at the end of eight weeks. The three and five step process yielded results in the 1 to 2000 megohm range depending on the type of colloidal composition and age of the composition. Over all the resistance increased with age of the colloidal composition. The resistance results did not always agree with the coverage factors (CF) as shown in Table VII below.

coverage factor for most of the three step data became worse after the sixth week except for the colloid containing ethyl-benzene sulfonate as dopant and the Rodasurf® TB 970 as stabilizer. The ethyl-benzene sulfonate and Rodasurf® TB 970 had a CF=0 for all eight weeks. Thus no dimpling or colloidal coating was found on the copper plated holes. The 5-step process had four good colloidal compositions for up to eight weeks. These compositions contained the dopants sodium C14–C16 olefin sulfonate, ethyl-benzene sulfonate, cumene sulfonate and paratoluene sulfonic acid with the stabilizer Rhodasurf® TB 970. The CF=0 for each of the compositions for all eight weeks.

The last functional property measured was the % film reported by % interconnect defect (ICD) as shown in Table VIII below. There was a lot of film left on the test panels processed by the two step method as shown by the data because no etch was done. In contrast, the test panels that were treated by the three and five step method had less film due to etching. The % ICD fell down to under 10% in most

TABLE VII (Coverage Factor)

| Dopant | Stabilizer | Two Step Process | Three Step Process | Five Step Process |
|---|---|---|---|---|
| Sodium C14–C16 olefin sulfonate | Ralufon ® F 11-13 | 0.5, 4, 1.1, 3.5, 4.0 | 0, 0, 0.05, 0.2, 0.35 | 0, 0, 0, 0, 0 |
| Ethyl-benzene sulfonate | Rhodasurf ® TB 970 | 0.3, 0.3, 0.3, 0.05, 0.6 | 0, 0, 0, 0, 0 | 0, 0, 0, 0, 0 |
| C12–C14 α fatty acid ester sulfonate | Avanel ® S 150 | 0.5, 0, 1.2, 0.65, 0.4 | 0, 0.1, 0.1, 0.1, 0.1 | 0, 0, 0, 0, 0.55 |
| Paratoluene sulfonic acid | Pluronic ® F 127 | 0.9, 0, 0.3, 0.3, 1.6 | 0, 0, 0, 0.4, 0.7 | 0, 0.1, 0, 0.55, 0 |
| Paratoluene sulfonic acid | Rhodasurf ® TB 970 | 0, 0, 0.1, 0.55, 0.8 | 0, 0, 0, 0, 0.7 | 0, 0, 0, 0, 0 |
| Cumene sulfonic acid | Pluronic ® F 127 | 0.5, 0.1, 0, 1.5, 0.4 | 0.3, 0, 0, 0, 0.25 | 0, 0, 0, 0, 0 |
| 3-sulfobenzoic acid | Pluronic ® F 127 | 0.9, 0, ---, 3.5, 2.2 | 0.6, 0, ---, 0, 0.1 | 0.4, 0, ---, 0.05, 0.45 |
| Xylene sulfonic acid | Pluronic ® F 127 | ---, 0, ---, 4, 4 | ---, ---, 0.3, 0.05, 4 | ---, 0, ---, 0, 4 |

The worst coverage was found in the two step process that had the lowest resistance of all the process methods. The low resistance values may have been caused by dissolution of the stabilizer from the colloidal particles during the etching. The colloids for both the three and the five step processes depending on the age and type of colloid. With some exceptions, the older the colloid the greater the % the ICD fell.

TABLE VIII (% Film)

| Dopant | Stabilizer | Two Step Process | Three step Process | Five Step Process |
|---|---|---|---|---|
| Sodium C14–C16 olefin sulfonate | Ralufon ® F 11-13 | 23, 100, 14, 94, 100 | 19, 8, 5, 8, 12 | 4, 4, 0, 8, 3 |
| Ethyl benzene sulfonate | Rhodasurf ® TB 970 | 3, 37, 1, 66, 21 | 9, 4, 1, 4, 0 | 1, 1, 0, 5, 2 |
| C12–C14 α fatty acid ester sulfonate | Avanel ® S 150 | 71, 24, 26, 61, 44 | 30, 4, 2, 26, 21 | 0, 0, 0, 2, 17 |
| Paratoluene sulfonic acid | Pluronic ® F 127 | 51, 7, 13, 15, 100 | 8, 2, 0, 2, 51 | 2, 0, 6, 4, 31 |
| Paratoluene sulfonic acid | Rhodasurf ® TB 970 | 51, 24, 57, 48, 29 | 1, 13, 2, 7, 2 | 4, 10, 5, 7, 2 |
| Cumene sulfonic acid | Pluronic ® F 127 | 80, 6, 30, 100, 28 | 6, 7, 4, 6, 4 | 27, 1, 6, 5, 18 |
| 3-sulfobenzoic acid | Pluronic ® F 127 | 12, 6, ---, 100, 58 | 9, 6, ----, 10, 9 | 0, 5, ----, 5, 2 |
| Xylene sulfonate | Pluronic ® F 127 | ----, 13, ----, 83, 83 | ----, 2, ----, 4, 4 | ----, 0, ----, 12, 1 |

Table IX provides the average resistance of the colloidal compositions over time for the two, three and five step processes over eight weeks. The average of all the measured colloidal compositions for the two step process was about 0.7 megohms and increased to about 218 megohms for the three step and about 424 megohms for the five step process.

TB 970. The average CF values were 0.3, 0, and 0 for the two, three and five step processes, respectively. The colloidal composition containing both the ethyl benzene sulfonate and the Rhodasurf® TB 970 also had the lowest overall % film. As a whole the CF improved after etching as shown by a CF=0 in the 3-step and 5-step processes. The average CF

TABLE IX (Resistance Summary in megohms)

| Dopant | Stabilizer | Two Step Process | Three Step Process | Five Step Process |
|---|---|---|---|---|
| Sodium C14–C16 olefin sulfonates | Ralufon ® F 11-13 | 0.43 | 129.2 | 47.8 |
| Ethyl benzene sulfonic acid | Rhodasurf ® TB 970 | 0.51 | 31.6 | 420.6 |
| C12–C14 α fatty acid ester sulfonates | Avanel ® S 150 | 1.01 | 717.0 | 167.2 |
| Paratoluene sulfonic acid | Pluronic ® F 127 | 0.63 | 206.6 | 262 |
| Paratoluene sulfonic acid | Rhodasurf ® TB 970 | 0.48 | 423.6 | 21 |
| Cumene sulfonic acid | Pluronic ® F 127 | 1.31 | 175 | 419 |
| 3-sulfobenzoic acid | Pluronic ® F 127 | 0.35 | 28.8 | 940.5 |
| Xylene sulfonic acid | Pluronic ® F 127 | 0.56 | 29.3 | 78 |
| —— | Total Average | 0.66 | 217.6 | 424.1 |

Table X summarizes both the coverage factor (CF) and the % film for all of the colloidal compositions. The averages over the eight weeks are listed for the two, three and five step processes for each colloidal composition. The best overall coverage was obtained from the colloidal composition having ethyl benzene sulfonate as the dopant and Rhodasurf® for all the colloids went from 1.04 for the two step process down to 0.29 for the 3-step process, and a 0.22 for the 5-step process. The % film improved by nearly a factor of 10 when the panels were etched. The average % film for all the colloids went from 45 for the two step process down to 7.2 for the 3-step process and 5.2 for the 5-step process.

TABLE X (Summary of CF and % Film)

| | | CF | | | % Film | | |
|---|---|---|---|---|---|---|---|
| Dopant | Stabilizer | 2-Step | 3-Step | 5-Step | 2-Step | 3-Step | 5-Step |
| Sodium C14–C16 olefin sulfonate | Ralufon ® F 11–13 | 1.9 | 0.12 | 0 | 66 | 10.4 | 3.8 |
| Ethyl-benzene sulfonate | Rhodasurf ® TB 970 | 0.3 | 0 | 0 | 26 | 3.6 | 1.8 |
| C12–C14 α fatty acid ester sulfonate | Avanel ® S 150 | 0.55 | 0.08 | 0.11 | 45 | 14.6 | 3.8 |

TABLE X-continued (Summary of CF and % Film)

| Dopant | Stabilizer | CF 2-Step | CF 3-Step | CF 5-Step | % Film 2-Step | % Film 3-Step | % Film 5-Step |
|---|---|---|---|---|---|---|---|
| Paratoluene sulfonic acid | Pluronic ® F 127 | 0.62 | 0.22 | 0.13 | 37 | 12.6 | 7.5 |
| Paratoluene sulfonic acid | Rhodasurf ® TB 970 | 0.29 | 0.14 | 0 | 42 | 2.6 | 5.6 |
| Cumene sulfonic acid | Pluronic ® F 127 | 0.23 | 0.11 | 0 | 49 | 3.2 | 11.4 |
| 3-sulfobenzoic acid | Pluronic ® F 127 | 1.7 | 0.2 | 0.23 | 43 | 7.1 | 3.0 |
| Xylene sulfonic acid | Pluronic ® F 127 | 2.7 | 1.45 | 1.3 | 60 | 3.3 | 4.3 |
| —— | Total Average | 1.04 | 0.29 | 0.22 | 46 | 7.2 | 5.2 |

All the colloidal compositions functionally decreased over time except the colloidal composition containing ethylbenzene sulfonate and Rhodasurf® TB 970. However, all of the colloidal compositions were still visually stable and were still being adsorbed onto the FR4 surface.

What is claimed is:

1. A conductive polymer colloidal composition comprising: a polymer, and a dopant having the following general formula:

where R" is H, methyl, ethyl, propyl or butyl group; x is an integer of from 12 to 14; y is an integer of from 1 to 14; and z is an integer of from 1 to 5; and R' is H, methyl ethyl or M, where M is a cation.

2. The conductive polymer colloidal composition of claim 1, wherein the polymer comprises polypyrrole, polyaniline, polythiophene, polyfuran or mixtures thereof.

3. The conductive polymer colloidal composition of claim 1, further comprising conductive colloidal particles of carbon, metals and their salts, or mixtures thereof.

4. The conductive polymer colloidal composition of claim 1, further comprising a stabilizer.

5. The conductive polymer colloidal composition of claim 4, wherein the stabilizer comprises a non-ionic polyether having the general formula:

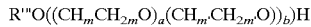

where R'" is a hydrocarbon group having from 1 to 40 carbon atoms, m and m' differ from each other and each is one or more integers of from 1 to 4, and a and b are integers varying between 0 and 1,000 provided that a+b is at least 3.

6. The conductive polymer colloidal composition of claim 4, wherein the stabilizer comprises a compound having the formula:

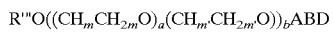

where R'" is a hydrocarbon group having from 1 to 40 carbon atoms, m and m' differ from each other and each is one or more integers of from 1 to 4, a and b are integers such that there are at least 20 ethoxylate groups in the formula, A is an anion, B is a counteracting cation, and D is an alkyl group of from 1 to 8 carbon atoms.

7. The conductive polymer colloidal composition of claim 4, wherein the stabilizer comprises a compound having the formula:

where m" is an integer ranging from 3 to 20, G is an alkali metal and n is an integer between 3 and 1000.

8. A method for preparing a conductive polymer colloidal composition comprising:

a) adding monomers to a dispersant;

b) adding a dopant to the dispersant comprising the monomers, the dopant having a formula:

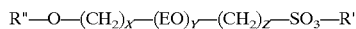

where R" is H, methyl, ethyl, propyl or butyl, x is an integer of from 12 to 14, y is an integer of from 1 to 14, z is an integer of from 1 to 5; R' is H, methyl, ethyl of M, where M is a cation; and c) mixing the monomers and dopant to form the conductive polymer colloidal composition.

9. The method of claim 8, further comprising a conductive colloidal particles of carbon, metals and their salts or mixtures thereof.

10. The method of claim 8, further comprising an oxidant, a preservative, a stabilizer, or mixtures thereof.

11. The method of claim 10, wherein the stabilizer comprises a non-ionic polyether having the formula:

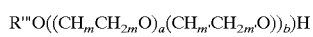

where R'" is a hydrocarbon group having from 1 to 40 carbon atoms, m and m' differ from each other and each is one or more integers of from 1 to 4, and a and b are integers varying between 0 and 1,000 provided that a+b is at least 3.

12. The method of claim 10, wherein the stabilizer comprises a compound having the formula:

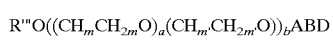

where R'" is a hydrocarbon group having from 1 to 40 carbon atoms, m and m' differ from each other and each is one or more integers of from 1 to 4, and a and b are integers such that are at least 20 ethoxylate groups in the formula, A is an anion, B is a counteracting cation, and D is an alkyl group having from 1 to 8 carbon atoms.

13. The method of claim 10, wherein the stabilizer comprises a compound having the formula:

where m" is an integer ranging from 3 to 20, G is an alkali metal and n is an integer from 3 to 1000.

14. A method for plating a surface of a substrate comprising:
   a) contacting the surface of the substrate with a conductive polymer colloidal composition to deposit a conductive polymer layer on the substrate, the conductive polymer colloidal composition comprises a polymer and a dopant, the dopant is a compound having the formula:

$$R''-O-(CH_2)_x-(EO)_y-(CH_2)_z-SO_3-R'$$

where R'' is H, methyl, ethyl, propyl or butyl, x is an integer of from 12 to 14, y is an integer of from 1 to 14, z is an integer of from 1 to 5; R' is H, methyl, ethyl of M, where M is a cation; and
   b) depositing a metal on the conductive polymer layer of the substrate.

15. The method of claim 14, wherein the conductive polymer colloidal composition further comprises conductive colloidal particles of carbon.

16. The method of claim 14, wherein the substrate is a printed wiring board.

17. The method of claim 16, wherein printed wiring is multi-layered.

* * * * *